United States Patent
Jeong et al.

(10) Patent No.: US 8,748,932 B2
(45) Date of Patent: Jun. 10, 2014

(54) LIGHT EMITTING DEVICE HAVING CURVED TOP SURFACE WITH FINE UNEVENNESS

(75) Inventors: Jong Pil Jeong, Seoul (KR); Jung Hyun Hwang, Seoul (KR); Chong Cook Kim, Seoul (KR); Sung Jin Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 191 days.

(21) Appl. No.: 13/358,145

(22) Filed: Jan. 25, 2012

(65) Prior Publication Data

US 2012/0187365 A1    Jul. 26, 2012

(30) Foreign Application Priority Data

Jan. 26, 2011 (KR) .................. 10-2011-0007926
Jun. 24, 2011 (KR) .................. 10-2011-0061648

(51) Int. Cl.
*H01L 33/00* (2010.01)

(52) U.S. Cl.
USPC ............... 257/103; 257/9; 257/79; 257/98; 257/E33.005; 257/E33.011

(58) Field of Classification Search
USPC ........... 257/9, 79, 98, 103, E33.005, E33.011
See application file for complete search history.

(56) References Cited

U.S. PATENT DOCUMENTS

| | | | | |
|---|---|---|---|---|
| 2009/0315054 A1* | 12/2009 | Kim et al. | ...................... | 257/98 |
| 2010/0314653 A1* | 12/2010 | Orita et al. | ...................... | 257/98 |
| 2011/0260192 A1* | 10/2011 | Kwak et al. | ..................... | 257/98 |
| 2013/0069034 A1* | 3/2013 | Hirayama | ....................... | 257/13 |

FOREIGN PATENT DOCUMENTS

WO    WO 2011/104969    * 9/2011    ............. H01L 33/32

* cited by examiner

*Primary Examiner* — Matthew Reames
*Assistant Examiner* — Farid Khan
(74) *Attorney, Agent, or Firm* — Birch, Stewart, Kolasch & Birch, LLP

(57) ABSTRACT

Provided are a light emitting device, a method of fabricating the light emitting device, a light emitting device package, and a lighting system. The light emitting device comprises a first conductive type semiconductor layer, a light emitting layer over the first conductive type semiconductor layer, an electron blocking layer over the light emitting layer, and a second conductive type semiconductor layer over the electron blocking layer. The electron blocking layer comprises a pattern having a height difference.

17 Claims, 5 Drawing Sheets

LIGHT EMITTING DEVICE HAVING CURVED TOP SURFACE WITH FINE UNEVENNESS

CROSS-REFERENCE TO RELATED APPLICATIONS

This application claims under 35 U.S.C. §119 to Korean Patent Application No. 10-2011-0007926, filed Jan. 26, 2011 and Korean Patent Application No. 10-2011-0061648, filed Jun. 24, 2011, which are hereby incorporated by reference in their entireties.

BACKGROUND

Embodiments relate to a light emitting device, a method of fabricating the light emitting device, a light emitting device package, and a lighting system.

Light emitting devices (LEDs) are compound semiconductor devices that convert electric energy into light energy. Here, a compositional ratio of a compound semiconductor may be adjusted to realize various colors.

Recently, low voltage/high power driving devices become popular in markets for LED backlight units. For maintaining luminous intensity while an operation voltage is improved, many studies with respect to an epitaxial end are being developed. Specifically, various plans for improving an operation voltage (VF) are being attempted.

SUMMARY

Embodiments provide a light emitting device capable of increasing luminance intensity and improving an operation voltage VF, a method of fabricating the light emitting device, a light emitting device package, and a lighting system.

In one embodiment, a light emitting device comprises: a first conductive type semiconductor layer; a light emitting layer over the first conductive type semiconductor layer; an electron blocking layer over the light emitting layer; and a second conductive type semiconductor layer over the electron blocking layer, wherein the electron blocking layer comprises a pattern having a height difference.

According to the a light emitting device, a method of fabricating the light emitting device, a light emitting device package, and a lighting system, the luminance intensity may be increased, and also the operation voltage (Vf) may be improved.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a method of fabricating the light emitting device, a light emitting device package, and a lighting system according to embodiments will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

Figure 1:
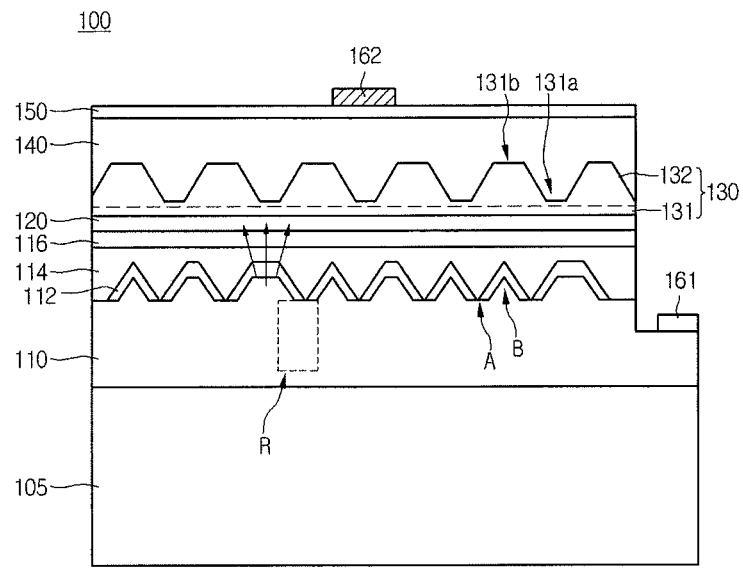
FIG. 1 is a sectional view of a light emitting device according to an embodiment.

FIG. 1 is a sectional view of a light emitting device 100 according to an embodiment. Here, although a lateral-type light emitting device is illustrated as an example, the present disclosure is not limited thereto.

The light emitting device 100 may include a first conductive type semiconductor layer 110, a second conductive type semiconductor layer 140, and a light emitting layer 120 disposed between the first conductive type semiconductor layer 110 and the second conductive type semiconductor layer 140.

Here, the first conductive type semiconductor layer 110 may be a semiconductor layer doped with an N-type dopant (e.g., Si). Also, the second conductive type semiconductor layer 140 may be a semiconductor layer doped with a P-type dopant (e.g., Mg). Hereinafter, although this application will be described on the basis of the above-described structure, the present disclosure is not limited thereto.

An electron blocking layer 130 may be further disposed between the second conductive type semiconductor layer 140 and the light emitting layer 120.

The electron blocking layer 130 may improve recombination between electrons and holes and prevent a leakage current from occurring. The electron blocking layer 130 may prevent electrons injected from the first conductive type semiconductor layer 110 into the light emitting layer 120 from flowing into the second conductive type semiconductor layer 140 without being recombined with the holes in the light emitting layer 120 when a high current is applied.

That is, since the electron blocking layer 130 has a relatively large band gap than that of the light emitting layer 120, the electron blocking layer 130 may prevent the electrons injected from the first conductive type semiconductor layer 110 from being injected into the second conductive type semiconductor layer 140 without being recombined with holes in the light emitting layer 120.

When the electron blocking layer 130 is thicker, recombination efficiency may be improved to increase light emitting efficiency. However, the thick electron blocking layer 130 may interrupt the movement of holes supplied from the second conductive type semiconductor layer 140, and thus an operation voltage Vf may be increased.

The electron blocking layer 130 according to the current embodiment includes a pattern having thicknesses different from each other. For example, as shown in FIG. 1, the electron blocking layer 130 may includes a peak 131b having a relatively thick thickness and a valley 131a having a relatively thin thickness.

The electrons injected from the first conductive type semiconductor layer 110 may be further blocked at the peak 131b to maximize the light emitting efficiency.

Also, the interruption of the movement of the holes injected from the second conductive type semiconductor layer 140 may be minimized to minimize an increase of the operation voltage Vf. That is, the light emitting device 100 according to the current embodiment may include the thick electron block layer 130 to maximize an electron blocking effect. In addition, the light emitting device 100 may include the thin valley 131 through which the holes easily passes to prevent the operation voltage Vf from being increased.

The electron blocking layer 130 may have a thickness of about 100 Å to about 600 Å. To maximize the blocking effect of the electron blocking layer 130, the electron blocking layer may have a thickness of about 300 Å to about 500 Å. However, the present disclosure is not limited thereto.

The electron blocking layer 130 may include the P-type dopant. For example, the electron blocking layer 130 may be doped with Mg at a concentration of about $10^{18}/cm^3$ to about $10^{20}/cm^3$, but is not limited thereto.

The electron blocking layer 130 may include a first electron blocking layer 131 disposed at a lower portion thereof and a second electron blocking layer 132 disposed on the first electron blocking layer 131.

Here, the first electron blocking layer 131 may be a portion including the pattern having the same thickness. The first electron blocking layer 131 may block the electrons and also serve as a cladding layer of the light emitting layer 120. Also, an upper layer of the first blocking layer 131 may be lattice-matched with the light emitting layer 120. For example, the first electron blocking layer 131 may block an electric wave of dislocations D (see FIG. 3, and that will be described later) generated due to lattice mismatching between a substrate 105 and a light emitting structure.

The first electron blocking layer 131 may have a thin layer shape. The first electron blocking layer 131 may include at least one mono layer and have a thickness of about 5 Å or more. For example, the first electron blocking layer 131 may have a thickness of about 5 Å to 10 Å, but is not limited thereto.

The first electron blocking layer 131 may be formed of a material having a compositional formula of $Al_xIn_yGa_{(1-x-y)}N$ ($0 \leq x+y \leq 1$). Here, the first electron blocking layer 131 may have an Al content of about 10% or more ($0.1 \leq x \leq 1$). Also, the first electron blocking layer 131 may have an In content of about 30% or less ($0 \leq y \leq 0.3$).

The second electron blocking layer 132 may be a portion including the pattern having thicknesses different from each other. The second electron blocking layer 132 may be formed of a material having a compositional formula of $Al_xIn_yGa_{(1-x-y)}N$ ($0 \leq x+y \leq 1$). Here, the second electron blocking layer 132 may have an Al content of about 10% or more ($0.1 \leq x \leq 1$). For example, the Al content may range from about 15% to about 19% ($0.15 \leq x \leq 0.19$), but is not limited thereto.

Figure 2:
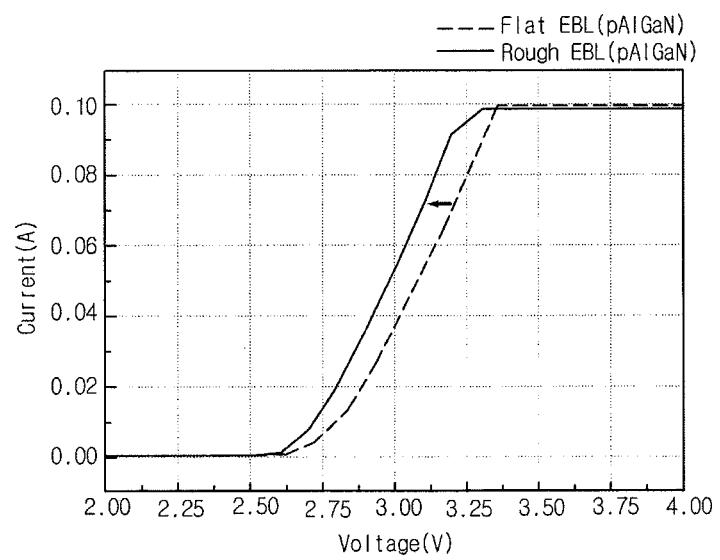
FIG. 2 is a view illustrating an example of an improved operation voltage of the light emitting device according to an embodiment.

FIG. 2 is a view illustrating an example of an improved operation voltage of the light emitting device according to an embodiment.

Referring to FIG. 2, the rough electron blocking layer (EBL) having a height difference may be provided in the current embodiment to improve luminance intensity and reduce the operation voltage by about 0.12 V or more when compared to a flat EBL according to a related art. For example, the operation voltage may be improved to about 3.15 V from existing about 3.25 V at an operation current of about 95 mA/cm².

Referring again to FIG. 1, an electron injection layer 116 and a current spreading layer 114 may be further disposed between the first conductive type semiconductor layer 110 and the light emitting layer 120.

Also, a surface of the first conductive type semiconductor layer 110 contacting the current spreading layer 114 may include a wedge-shaped embayment portion. A clad layer 113 may be further disposed on the wedge-type embayment portion.

For example, the wedge-shaped embayment portion may be formed on a top surface of the first conductive type semiconductor layer 110 by adjusting a temperature or pressure when the first conductive type semiconductor layer 110 is grown.

The first conductive type semiconductor layer 110 may be grown using a semiconductor material having a compositional formula of $In_xAl_yGa_{1-x-y}N$. A recessed portion A may have a triangular shape in section. When viewed from an upper side, the recessed portion A may have a hexagonal shape. For example, the recessed portion A may have a hexagonal hone shape, but is not limited thereto.

As described above, a roughness may be selectively formed on a portion in which the dislocations D are generated. Here, since the recessed portion A of the roughness has a resistance greater than that of a protrusion portion, the portion in which the dislocations D are generated may be increased in resistance to form a high resistance region R.

Thus, when static electricity is applied, a current concentrated through the dislocations D may be blocked by the high resistance region to reduce a leakage current due to the dislocations D, thereby improving an ESD resistance of the light emitting device 100. Here, the electrons that serve as carriers may be moved through the protrusion part B having a low resistance and superior crystalline.

In the current embodiment, a nitride semiconductor super lattice layer 112 may be further disposed on the protrusion part of the first conductive type semiconductor layer 110. The nitride semiconductor super lattice layer 112 may be doped with an N-type doping element. For example, an AlGaN/GaN super lattice layer 112 having a thickness of about 10 Å to about 1000 Å may be further disposed on the first conductive type semiconductor layer 110. The AlGaN/GaN super lattice layer 112 may be doped with the N-type doping element.

The nitride semiconductor super lattice layer 112 may prevent the dislocations D from being transferred into the light emitting layer 120 to improve the crystalline, thereby improving the light emitting efficiency of the light emitting device 100.

Also, in the current embodiment, an undoped nitride semiconductor layer 114 and an electron injection layer 116 may be further disposed on the first conductive type semiconductor layer 110.

For example, an undoped GaN layer 114 and an electron injection layer 116 may be further disposed on the first conductive type semiconductor layer 110. The undoped nitride semiconductor layer 114 may fill the roughness to planarize the top surface the first conductive type semiconductor layer 110.

Also, the electron injection layer 116 may be a first conductive type nitride gallium layer. For example, the electron injection layer 116 may be doped with the N-type doping element at a concentration of $6.0 \times 10^{18}$ atoms/cm³ to $8.0 \times 10^{18}$ atoms/cm³. Thus, the electrons may be effectively injected.

The electron injection layer 116 may have a thickness of about 1000 Å or less, but is not limited thereto.

Considering the efficiency and fabricating process of the light emitting device, the sum of thicknesses of the undoped nitride semiconductor layer 114 and the electron injection layer 116 may be below about 1 μm, but is not limited thereto.

According to the current embodiment, the electrons may smoothly supplied in a region of the protrusion portion B of the first conductive type semiconductor layer 110 to improve the luminance intensity. A region of the recessed portion A of the first conductive type semiconductor layer 110 may be a high resistance region R. Thus, the recessed portion A of the first conductive type semiconductor layer 110 may interrupt the expansion of the dislocations and the leakage current to prevent the operation voltage from being increased.

An ohmic layer 150 may be further disposed on the second conductive type semiconductor layer 140. The first conductive type semiconductor layer 110 may be exposed by mesa etching to form a first electrode 161, and a second electrode 162 may be disposed on the second conductive type semiconductor layer 140.

According to the light emitting device, a method of fabricating the light emitting device, a light emitting device package, and a lighting system according to an embodiment, the luminance intensity may be increased, and also the operation voltage VF may be improved.

Hereinafter, a method of fabricating the light emitting device according to an embodiment will be described with reference to FIGS. 3A to 5.

Figure 3A:
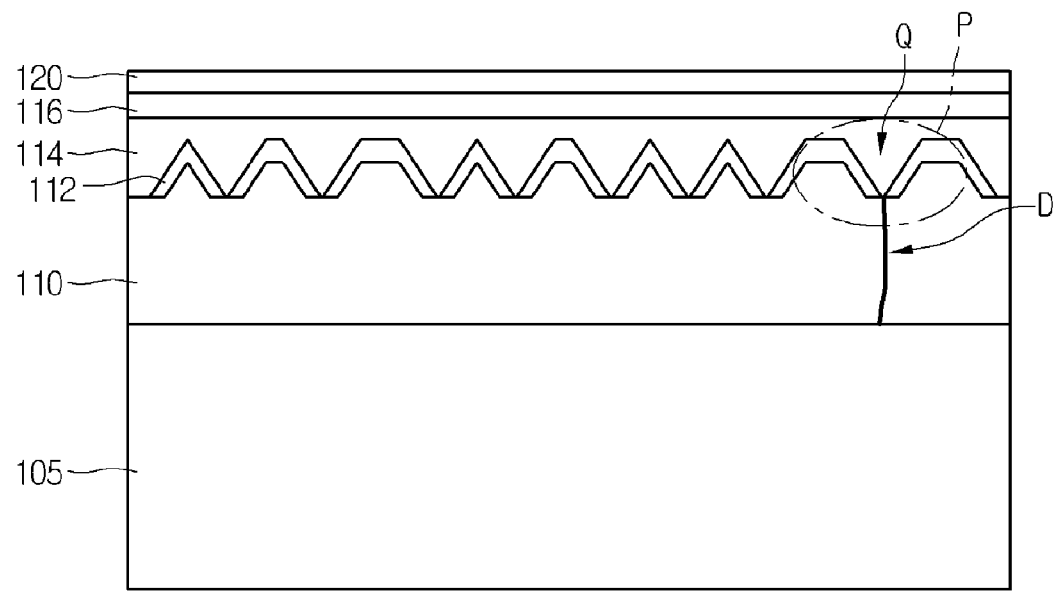
FIGS. 3 to 5 are sectional views illustrating a process of fabricating the light emitting device according to an embodiment.

First, as shown in FIG. 3A, a substrate 105 is prepared. The substrate 105 may include a conductive substrate or an insulating substrate. For example, the substrate 105 may be formed of at least one of ($Al_2O_3$), SiC, Si, GaAs, GaN, ZnO, GaP, InP, Ge, and $Ga_2O_3$. A roughness structure may be disposed on the substrate 105, but is not limited thereto. A wet cleaning process may be performed on the substrate 105 to remove dopants from a surface of the substrate 105.

In the current embodiment, a buffer layer (not shown) may be formed on the substrate 105. The buffer layer may reduce lattice mismatching between the material of the light emitting structure and the substrate 105. The buffer layer may be formed of at least one of group III-V compound semiconductors, for example, GaN, InN, AlN, InGaN, AlGaN, InAlGaN, and AlInN.

Thereafter, a first conductive type semiconductor layer 110 may be formed on the substrate 105 or the buffer layer.

The first conductive type semiconductor layer 110 may be formed of a group III-V compound semiconductor doped with a first conductive type dopant. When the first conductive type semiconductor layer 110 is an N-type semiconductor layer, the first conductive type dopant may include Si, Ge, Sn, Se, or Te as the N-type dopant, but is not limited thereto.

The first conductive type semiconductor layer 110 may be formed of a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 110 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 110 may be formed as an N-type GaN layer by using a method such as chemical vapor deposition (CVD), molecular beam epitaxy (MBE), sputtering, or hydride vapor phase epitaxy (HVPE). Also, the first conductive type semiconductor layer 110 may be formed by injecting silane ($SiH_4$) gas containing N-type dopants such as trimethyl gallium (TMGa) gas, ammonia ($NH_3$) gas, nitrogen ($N_2$) gas, and silicon (Si) into a chamber.

In the current embodiment, a wedge-shaped embayment portion may be formed on a top surface of the first conductive type semiconductor layer 110.

For example, the wedge-shaped embayment portion Q may be formed on the top surface of the first conductive type semiconductor layer 110 by adjusting a temperature or pressure when the first conductive type semiconductor layer 110 is grown.

Figure 3B:
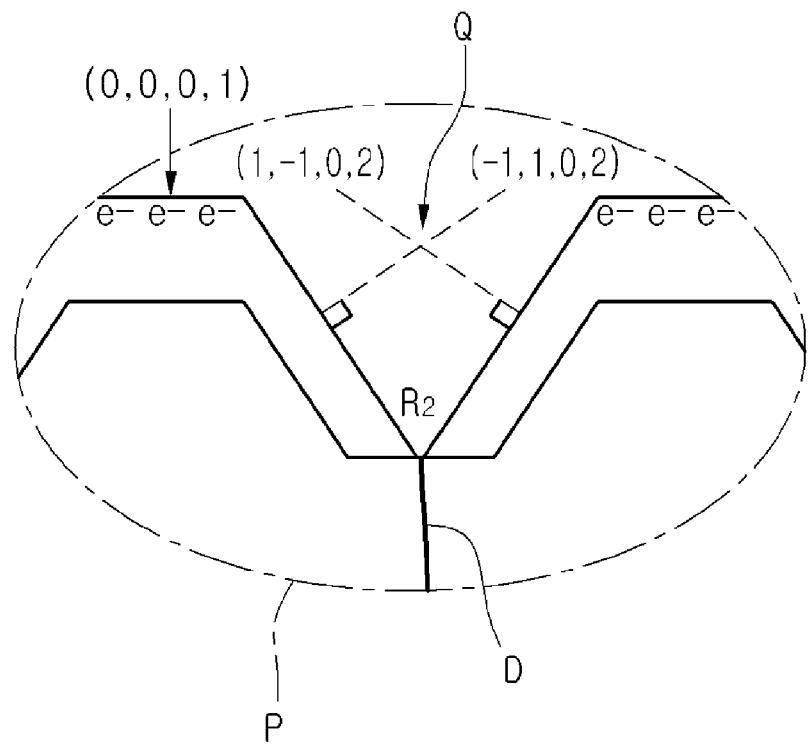

FIG. 3B is an enlarged view illustrating a portion P of the wedge-shaped embayment portion Q in the light emitting device according to an embodiment. The wedge-shaped embayment portion Q may be called a protrusion portion, but is not limited thereto.

For example, when the first conductive type semiconductor layer 110 is grown at a temperature of about 550° C. to about 940° C. and a pressure of about 100 torr to about 500 torr, the wedge-shaped embayment portion Q may be formed on the top surface of the first conductive type semiconductor layer 110.

The first conductive type semiconductor layer 120 may be grown using a semiconductor material having a compositional formula of $In_xAl_yGa_{1-x-y}N$. A recessed portion A may have a triangular shape in section. When viewed from an upper side, the recessed portion A may have a hexagonal shape. For example, the recessed portion A may have a hexagonal hone shape, but is not limited thereto.

As described above, the roughness may be selectively formed on a portion in which the dislocations D are generated. Here, since the recessed portion A of the roughness has a resistance greater than that of a protrusion portion, the portion in which the dislocations D are generated may be increased in resistance to form a high resistance region R.

Thus, when static electricity is applied, a current concentrated through the dislocations D may be blocked by the high resistance region to reduce a leakage current due to the dislocations D, thereby improving an ESD resistance of the light emitting device 100. Here, electrons that serve as carriers may be moved through the protrusion part B having a low resistance and superior crystalline.

For example, since the first conductive type semiconductor layer 110 is grown using the semiconductor material having the compositional formula of $In_xAl_yGa_{1-x-y}N$ ($0 \leq x \leq 1$, $0 \leq y \leq 1$, $0 \leq x+y \leq 1$), the wedge-shaped embayment portion Q may have a triangular sectional shape defined by a first inclined surface $(1, -1, 0, 2)$ and a second inclined surface $(-1, 1, 0, 2)$ which are two inclined surfaces connected to a growth surface $(0, 0, 0, 1)$ of the first conductive type semiconductor layer 110 as shown in FIG. 3B. Also, when viewed in a plane, the wedge-shaped embayment portion Q may have a hexagonal shape. Thus, the wedge-shaped embayment portion Q may have a hexagonal hone shape, but is not limited thereto.

As described above, since the wedge-shaped embayment portion Q is selectively formed in the portion in which the dislocations D are formed and a peak portion of the wedge-shaped embayment portion Q has a resistance R2 greater than that of the growth surface $(0, 0, 0, 1)$ of the first conductive type semiconductor layer 110, the portion in which the dislocations are generated may be increased in resistance. Thus, when static electricity is applied, a current concentrated through the dislocations D may be blocked to reduce the leakage current due to the dislocations D, thereby improving an ESD resistance of the light emitting device 100. Here, the current may be moved through the growth surface $(0, 0, 0, 1)$ of the first conductive type semiconductor layer 110 having a low resistance and superior crystalline.

In the current embodiment, a nitride semiconductor super lattice layer 112 may be further formed on the protrusion part of the first conductive type semiconductor layer 110. The nitride semiconductor super lattice layer 112 may be doped with an N-type doping element. For example, an AlGaN/GaN super lattice layer 112 having a thickness of about 10 Å to about 1000 Å may be further disposed on the first conductive type semiconductor layer 110. The AlGaN/GaN super lattice layer 112 may be doped with the N-type doping element.

The nitride semiconductor super lattice layer 112 may prevent the dislocations D from being transferred into the light emitting layer 120 to improve the crystalline, thereby improving light emitting efficiency of the light emitting device 100.

According to the current embodiment, the electrons may smoothly supplied in a region of the protrusion portion B of the first conductive type semiconductor layer 110 to improve the luminance intensity. A region of the recessed portion A of the first conductive type semiconductor layer 110 may be a high resistance region R. Thus, the recessed portion A of the first conductive type semiconductor layer 110 may interrupt the expansion of the dislocations and the leakage current to prevent the operation voltage from being increased.

Also, in the current embodiment, an undoped nitride semiconductor layer 114 may be further formed on the first conductive type semiconductor layer 110 or the nitride semiconductor super lattice layer 112.

For example, the undoped nitride semiconductor layer 114 may have a thickness of about 3000 Å to about 5000 Å at a temperature of about 1000° C. to about 1100° C. and a pressure of about 150 torr to about 250 torr.

Since the undoped nitride semiconductor layer 114 is grown at a temperature greater than a growth temperature of the first conductive type semiconductor layer 110, the undoped nitride semiconductor layer 114 may fill the roughness and have a flat top surface. Thus, each of layers to be formed on the undoped nitride semiconductor layer 114 may have superior crystalline.

Thereafter, an electron injection layer 116 may be formed on the undoped nitride semiconductor layer 114. The electron injection layer 116 may be a first conductive type nitride gallium semiconductor layer. For example, the electron injection layer 116 may be doped with an N-type doping element such as Si and have a thickness of about 1000 Å or less, but is not limited thereto.

For example, the electron injection layer 116 may be doped with the N-type doping element at a concentration of $6.0 \times 10^{18}$ atoms/cm3 to $8.0 \times 10^{18}$ atoms/cm$^3$. Thus, the electrons may be effectively injected.

Considering the efficiency and fabricating process of the light emitting device, the sum of thicknesses of the undoped nitride semiconductor layer 114 and the electron injection layer 116 may be below about 1 μm, but is not limited thereto.

Thereafter, a light emitting layer 120 may be formed on the first conductive type semiconductor layer 110 or the electron injection layer 116.

The light emitting layer 120 may be a layer in which electrons injected through the first conductive type semiconductor layer 110 meet holes injected through the second conductive type semiconductor layer 140 to be formed later to emit light having energy determined by a proper energy band of an active layer (light emitting layer).

The light emitting layer 120 may have at least one of a single quantum well structure, a multi quantum well (MQW) structure, a quantum wire structure, and a quantum dot structure. For example, the light emitting layer 120 may have the multi quantum well (MQW) structure that is formed by injecting trimethyl gallium (TMGa) gas, ammonia (NH$_3$) gas, nitrogen (N$_2$) gas, and trimethyl indium (TMIn) gas, but the present disclosure is not limited thereto.

The light emitting layer 120 may have a pair structure of at least one of InGaN/GaN, InGaN/InGaN, GaN/AlGaN, InAlGaN/GaN, GaAs(InGaAs)/AlGaAs, and GaP(InGaP)/AlGaP, but the present disclosure is not limited thereto. The well layer may be formed of a material having a band gap less than that of the barrier layer.

Figure 4:
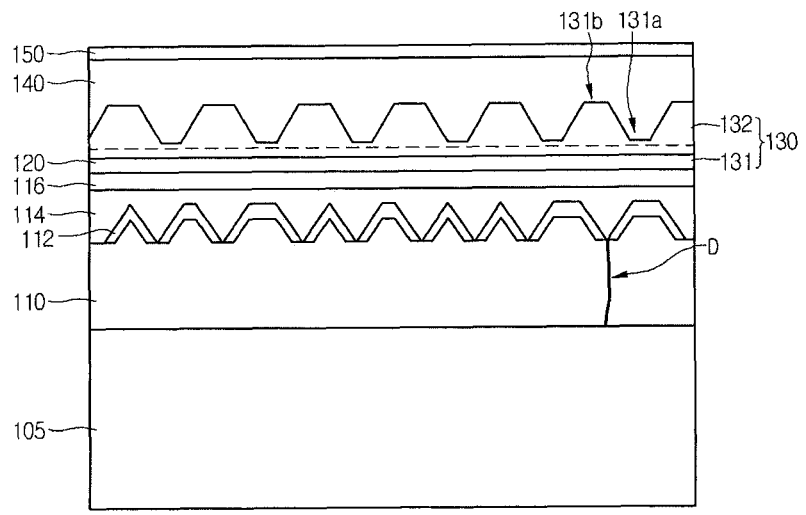
Figure 5:
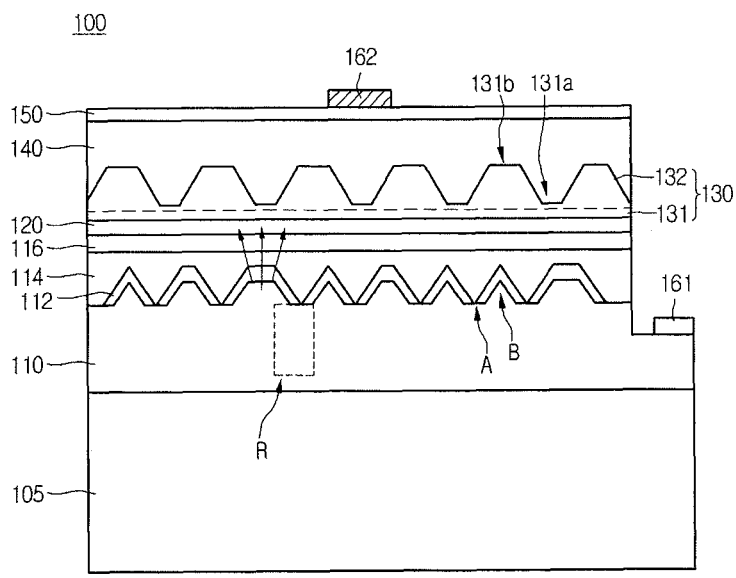

Referring to FIG. 4, an electron blocking layer 130 may be formed on the light emitting layer 120.

That is, since the electron blocking layer 130 has a relatively large band gap than that of the light emitting layer 120, the electron blocking layer 130 may prevent the electrons injected from the first conductive type semiconductor layer 110 from being injected into the second conductive type semiconductor layer 140 without being recombined with holes in the light emitting layer 120.

The electron blocking layer 130 may include a first electron blocking layer 131 formed on the light emitting layer 120 and a second electron blocking layer 132 formed on the first electron blocking layer 131.

Here, the first electron blocking layer 131 may be a portion including a pattern having the same thickness. The first electron blocking layer 131 may block the electrons and also serve as a cladding layer of the light emitting layer 120. Also, an upper layer of the first blocking layer 131 may be lattice-matched with the light emitting layer 120. For example, the first electron blocking layer 131 may block an electric wave of dislocations D generated due to lattice mismatching between a substrate 105 and a light emitting structure.

The first electron blocking layer 131 may have a thin layer shape. The first electron blocking layer 131 may include at least one mono layer and have a thickness of about 5 Å or more.

The second electron blocking layer 131 may be formed of a material having a compositional formula of $Al_xIn_yGa_{(1-x-y)}N$ (0≤x+y≤1). Here, the first electron blocking layer 131 may have an Al content of about 10% or more (0.1≤x≤1). Also, the first electron blocking layer 131 may have an In content of about 30% or less (0≤y≤0.3).

The second electron blocking layer 132 may be a portion including the pattern having thicknesses different from each other. The second electron blocking layer 132 may be formed of a material having a compositional formula of $Al_xIn_yGa_{(1-x-y)}N$ (0≤x+y≤1). Here, the second electron blocking layer 132 may have an Al content of about 10% or more (0.1≤x≤1). For example, the Al content may range from about 15% to about 19% (0.15≤x≤0.19), but is not limited thereto.

Thus, the electron blocking layer 130 according to the current embodiment may include a pattern having a height difference on the whole. For example, the electron blocking layer 130 may includes a peak 131b having a relatively thick thickness and a valley 131a having a relatively thin thickness.

The electrons injected from the first conductive type semiconductor layer 110 may be further blocked at the peak 131b to maximize the light emitting efficiency.

Also, the interruption of the movement of the holes injected from the second conductive type semiconductor layer 140 may be minimized to minimize an increase of an operation voltage Vf. That is, the light emitting device 100 according to the current embodiment may include the thick electron block layer 130 to maximize an electron blocking effect. In addition, the light emitting device 100 may include the thin valley 131 through which the holes easily passes to prevent the operation voltage Vf from being increased.

The electron blocking layer 130 may have a thickness of about 100 Å to about 600 Å. To maximize the blocking effect of the electron blocking layer 130, the electron blocking layer may have a thickness of about 300 Å to about 500 Å. However, the present disclosure is not limited thereto.

The electron blocking layer 130 may include a P-type dopant. For example, the electron blocking layer 130 may be doped with Mg at a concentration of about $10^{18}/cm^3$ to about $10^{20}/cm^3$, but is not limited thereto.

According to the current embodiment, the operation voltage may be improved using a rough P-type AlGaN layer to manufacture a device having high efficiency.

According to the current embodiment, the rough electron blocking layer (EBL) having the height difference may be provided to improve the luminance intensity and reduce the operation voltage by about 0.12 V or more when compared to a flat EBL according to a related art.

Thereafter, the second conductive type semiconductor layer 140 is formed on the electron blocking layer 130.

The second conductive type semiconductor layer 140 may be formed of a group III-V compound semiconductor that is doped with a second conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). When the second conductive type semiconductor layer 140 is a P-type semiconductor layer, the second conductive type dopant may include Mg, Zn, Ca, Sr, or Ba as a P-type dopant.

The second conductive type semiconductor layer 140 may be formed as a P-type GaN layer by injecting trimethyl gallium (TMGa) gas, ammonia (NH3) gas, nitrogen (N2) gas, and bis-ethyl-cyclopentadienyl-magnesium (EtCp$_2$Mg) {Mg(C$_2$H$_5$C$_5$H$_4$)$_2$} containing the P-type dopant such as magnesium (Mg) into a chamber, but the present disclosure is not limited thereto.

In the embodiment, the first conductive type semiconductor layer 110 may be an N-type semiconductor layer, and the second conductive type semiconductor layer 140 may be a P-type semiconductor layer, but the present disclosure is not limited thereto. Also, a semiconductor having a polarity opposite to that of the second conductive type semiconductor layer, e.g., an N-type semiconductor layer (not shown) may be formed on the second conductive type semiconductor layer 140. Accordingly, the light emitting structure may have one of an N-P junction structure, a P-N junction structure, an N-P-N junction structure and a P-N-P junction structure.

Thereafter, an ohmic layer 150 is formed on the second conductive type semiconductor layer 140.

For example, the ohmic layer 150 may be formed as a multi layer of a metal, a metal alloy, and a metal oxide to efficiently inject the carriers. For example, the ohmic layer (150) may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZON (IZO Nitride), AGZO (Al—Ga ZnO), IGZO (In—Ga ZnO), ZnO, IrO$_x$, RuO$_x$, NiO, RuO$_x$/ITO, Ni/IrO$_x$/Au, and Ni/IrO$_x$/Au/ITO, Ag, Ni, Cr, Ti, Al, Rh, Pd, Ir, Ru, Mg, Zn, Pt, Au, and Hf, but the present disclosure is not limited thereto.

Thereafter, a mesa etching process may be performed to expose a portion of the first conductive type semiconductor layer 110 to form a first electrode 161 on the exposed first conductive type semiconductor layer 110. Then, a second electrode 162 may be formed on the second conductive type semiconductor layer 140 or the ohmic layer 150.

According to the light emitting device and the method of fabricating the light emitting device, the luminance intensity may be increased, and also the operation voltage VF may be improved.

Figure 6:
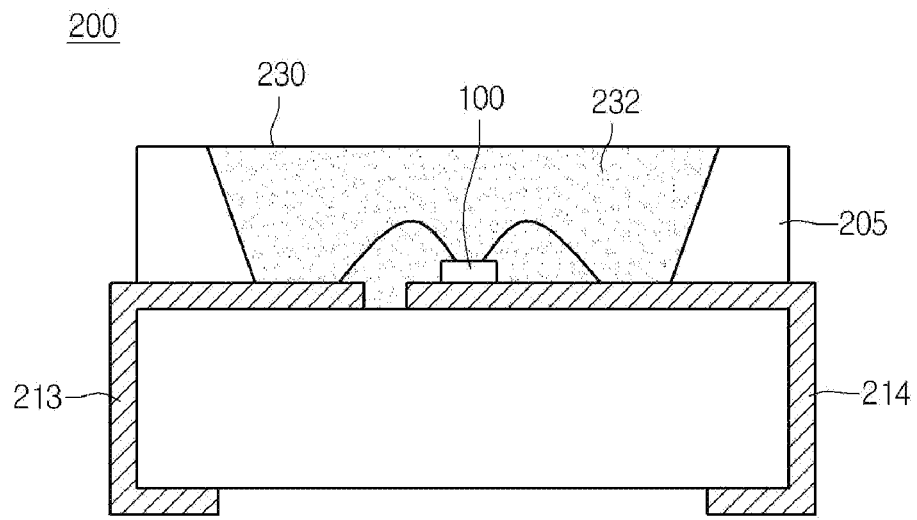
FIG. 6 is a sectional view of a light emitting device package according to an embodiment.

FIG. 6 is a sectional view illustrating a light emitting device package 200 including the light emitting device according to embodiments.

Referring to FIG. 6, the light emitting device package 200 according to an embodiment includes a package body 205, third and fourth electrode layers 213 and 214 disposed on the package body 205, a light emitting device 100 disposed on the package body 205 and electrically connected to the third and fourth electrode layers 213 and 214, and a molding member 230 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 are electrically separated from each other and supply power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be applied to the lateral type light emitting device exemplified in FIG. 1, but the present disclosure is not limited thereto. Alternatively, the light emitting device 100 may be applied to a flip-chip light emitting device.

The light emitting device 100 may be disposed on the package body 205 or the first or second electrode layer 213 or 214.

The light emitting device 100 may be electrically connected to the first and/or second electrode layers 213 and/or 214 through one of a wiring process, a flip-chip process, and a die bonding process. Although the light emitting device 100 is electrically connected to the third and fourth conductive layers 213 and 124 through wires in the current embodiment, the present disclosure is not limited thereto.

The molding member 230 may surround the light emitting device 100 to protect the light emitting device 100. The molding member 230 may include a phosphor 232 to vary a wavelength of light emitted form the light emitting device 100.

The light emitting device package may be provided in plurality on a board, and optical members such as a light guide plate, a prism sheet, a diffusion sheet, and a fluorescent sheet may be disposed in a path of light emitted from the light emitting device package. The light emitting device package, the board, and the optical members may function as a backlight unit or a lighting unit. For example, a lighting system may include backlight units, lighting units, indicating devices, lamps, and street lamps.

Figure 7:
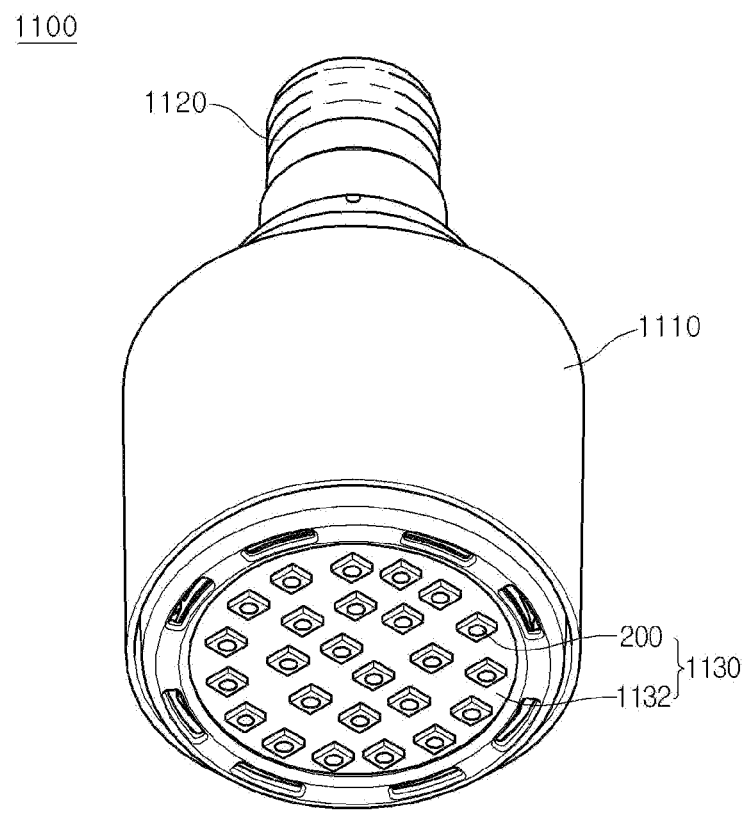
FIG. 7 is a perspective view of a lighting unit according to an embodiment.

FIG. 7 is a perspective view of a lighting unit 1100 according to an embodiment. However, the lighting unit 1100 of FIG. 7 is described as an example of the lighting system. Thus, the present disclosure is not limited thereto.

Referring to FIG. 7, the lighting unit 1100 may include a case body 1110, a light emitting module 1130 disposed on the case body 1110, and a connection terminal 1120 disposed on the case body 1110 to receive power from an external power source.

The case body 1110 may be formed of a material having good thermal dissipation properties, e.g., a metal material or a resin material.

The light emitting module 1130 may include a board 1132 and at least one light emitting device package 200 mounted on the board 1132.

A circuit pattern may be printed on a dielectric to manufacture the board 1132. For example, the board 1132 may include a printed circuit board (PCB), a metal core PCB, a flexible PCB, and a ceramic PCB.

Also, the board 1132 may be formed of a material which may effectively reflect light or have a color by which light is effectively reflected, e.g., a white color or a silver color.

The at least one light emitting device package 200 may be mounted on the board 1132. The light emitting device package 200 may include at least one light emitting diode (LED) 100. The LED may include color LEDs, which respectively emit light having a red color, a green color, a blue color, and a white color and an ultraviolet (UV) LED emitting UV rays.

The light emitting module 1130 may have combinations of several light emitting devices 200 to obtain desired color and brightness. For example, the white LED, the red LED, and the green LED may be combined with each other to secure a high color rendering index (CRI).

The connection terminal 1120 may be electrically connected to the light emitting module 1130 to supply power to the light emitting module 1130. Referring to FIG. 7, the connection terminal 1120 is screw-coupled to an external power source in a socket manner, but is not limited thereto. For example, the connection terminal 1120 may have a pin shape, and thus, be inserted into the external power source. Alternatively, the connection terminal 1120 may be connected to the external power source by a wire.

Figure 8:
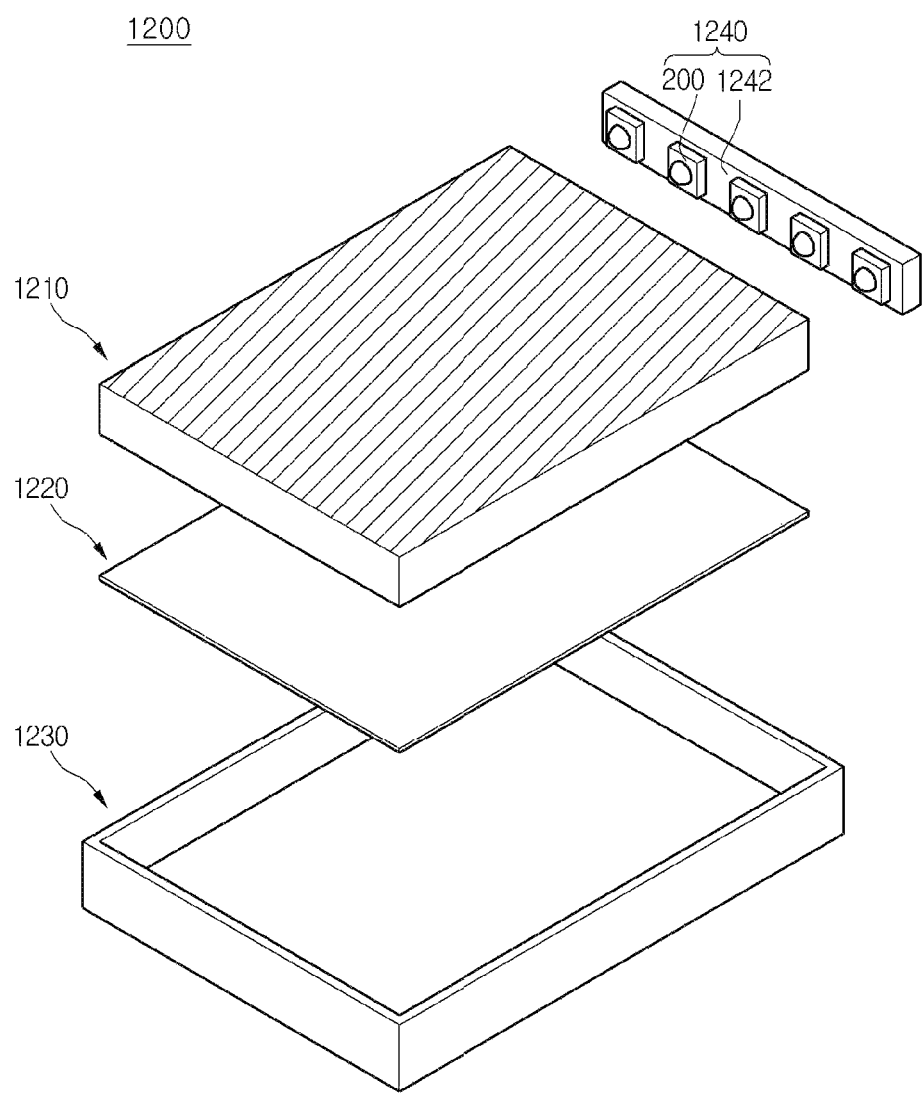
FIG. 8 is a perspective view of a backlight unit according to an embodiment.

FIG. 8 is an exploded perspective view of a backlight unit 1200 according to an embodiment. However, the backlight unit 1200 of FIG. 8 is described as an example of the lighting system. Thus, the present disclosure is not limited thereto.

The backlight unit 1200 according to the current embodiment may include a light guide plate 1210, a light emitting module 1240 providing light to the light guide plate 1210, a reflective member 1220 under the light guide plate 1210, and a bottom cover 1230 receiving the light guide plate 1210, the light emitting module 1240, and the reflective member 1220, but is not limited thereto.

The light guide plate 1210 diffuses light to produce planar light. For example, the light guide plate 1210 may be formed of a transparent material, e.g., one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may serve as a light source of a display device including the backlight unit 1200.

The substrate 1240 may contact the light guide plate 1210, but is not limited thereto. Specifically, the light emitting module 1240 may include a board 1242 and a plurality of light emitting device packages 200 mounted on the board 1242. Here, the board 1242 may contact the light guide plate 1210, but is not limited thereto.

The board 1242 may be a printed circuit board (PCB) including a circuit pattern (not shown). Alternatively, the board 1242 may include a metal core PCB (MCPCB) or a flexible PCB (FPCB) as well as a general PCB, but is not limited thereto.

The plurality of light emitting device packages 200 may be mounted on the board 1242 so that a light emission surface through which light is emitted is spaced a predetermined distance from the light guide plate 1210.

The reflective member 1220 may be disposed under the light guide plate 1210. Since the reflective member 1220 reflects light incident onto an under surface of the light guide plate 1210 to supply the light upward, the brightness of the backlight unit 1200 may be improved. For example, the reflective member 1220 may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press molding process or an extrusion molding process.

According to the light emitting device, the method of fabricating the light emitting device, the light emitting device package, and the lighting system according to an embodiment, the luminance intensity may be increased, and also the operation voltage VF may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive type semiconductor layer;
a light emitting layer over the first conductive type semiconductor layer;
an electron blocking layer over the light emitting layer; and
a second conductive type semiconductor layer over the electron blocking layer,
wherein the electron blocking layer comprises a pattern having a height difference, and
wherein the electron blocking layer comprises:
a first electron blocking layer which does not comprise the pattern; and
a second electron blocking layer comprising the pattern over the first electron blocking layer.

2. The light emitting device according to claim 1, wherein the electron blocking layer comprises a material having a compositional formula of $Al_xIn_yGa_{(1-x-y)}N$ ($0.1 \leq x \leq 1$, $0 \leq y \leq 0.3$, $0 \leq x+y \leq 1$).

3. The light emitting device according to claim 2, wherein the electron blocking layer comprises an Al content of about 10% or more and an In content of about 30% or less.

4. The light emitting device according to claim 1, wherein the electron blocking layer has a thickness of about 100 Å to about 600 Å.

5. The light emitting device according to claim 1, wherein the electron blocking layer has a thickness of about 300 Å to about 500 Å.

6. The light emitting device according to claim 1, wherein the first electron blocking layer has a thickness of about 5 Å to about 100 Å.

7. The light emitting device according to claim 1, wherein the second electron blocking layer comprises a peak and a valley.

8. The light emitting device according to claim 1, wherein the electron blocking layer comprises a second conductive type dopant.

9. The light emitting device according to claim 8, wherein the second conductive type dopant comprises Mg.

10. The light emitting device according to claim 8, wherein the electron blocking layer is doped with the second conductive type dopant at a concentration of about $10^{18}/cm^3$ to about $10^{20}/cm^3$.

11. The light emitting device according to claim 1, wherein a wedge-shaped embayment portion is disposed on a top surface of the first conductive type semiconductor layer.

12. The light emitting device according to claim 11, wherein the wedge-shaped embayment portion has a triangular shape in cross section.

13. The light emitting device according to claim 11, wherein a top surface of the wedge-shaped embayment portion has a hexagonal shape.

14. The light emitting device according to claim 11, wherein a recessed portion of the wedge-shaped embayment portion has a resistance greater than that of a growth surface of the first conductive type semiconductor layer.

15. The light emitting device according to claim 11, wherein a nitride semiconductor super lattice layer is further disposed on the wedge-shaped embayment portion.

16. The light emitting device according to claim 15, wherein the nitride semiconductor super lattice layer is doped with an N-type dopant.

17. The light emitting device according to claim 11, further comprising a clad layer disposed on the wedge-shaped embayment portion.

* * * * *